United States Patent
Kaneda et al.

(10) Patent No.: US 6,498,548 B2
(45) Date of Patent: Dec. 24, 2002

(54) SURFACE ACOUSTIC WAVE FILTER WITH OPTIMIZED WIDTH AND PITCH OF INTERDIGITAL ELECTRODES AND REFLECTOR ELECTRODES

(75) Inventors: Yasufumi Kaneda, Nagano (JP); Masanori Ueda, Nagano (JP); Osamu Kawachi, Nagano (JP); Takuya Abe, Nagano (JP)

(73) Assignee: Fujitsu Media Devices Limited, Nagano (JP)

(*) Notice: Subject to any disclaimer, the term of this patent is extended or adjusted under 35 U.S.C. 154(b) by 0 days.

(21) Appl. No.: 09/863,443

(22) Filed: May 24, 2001

(65) Prior Publication Data

US 2002/0070822 A1 Jun. 13, 2002

(30) Foreign Application Priority Data

Dec. 7, 2000 (JP) .......................... 2000-372999

(51) Int. Cl.⁷ .................................. H03H 9/64
(52) U.S. Cl. ................ 333/195; 310/313 D; 310/313 A
(58) Field of Search ................ 333/193–196; 310/313 R, 313 B, 313 C, 313 D, 313 A (56) References Cited

U.S. PATENT DOCUMENTS 5,731,748 A * 3/1998 Tada .......................... 333/193
5,909,158 A * 6/1999 Hiramoto .................... 333/195
6,037,847 A * 3/2000 Ueda et al. .................. 333/193

FOREIGN PATENT DOCUMENTS

| JP | 6-260880 | * 9/1994 | .................. 333/193 |
| JP | 7-283682 | * 10/1995 | |
| JP | 8-125489 | * 5/1996 | |
| JP | 9-148879 | * 6/1997 | |
| JP | 10-335973 | * 12/1998 | |
| JP | 11-251868 | * 9/1999 | |
| JP | 2000-13174 | * 1/2000 | |
| JP | 2000-323955 | * 11/2000 | |
| JP | 2001-127586 | * 5/2001 | |

* cited by examiner

*Primary Examiner*—Robert Pascal
*Assistant Examiner*—Barbara Summons
(74) *Attorney, Agent, or Firm*—Arent Fox Kintner Plotkin & Kahn, PLLC (57) ABSTRACT

A surface acoustic wave filter is free from any loss arising from the impedance mismatching by finding out optimum values achieving a widened band and lowered loss for the electrode width of the interdigital transducer and reflector electrodes. The surface acoustic wave filter includes interdigital transducers and reflectors arranged on both sides of the transducer. The piezoelectric substrate has a ratio $h/\lambda$ of an electrode thickness h to a surface acoustic wave wavelength $\lambda$ lying within the range of $0.05 \leq h/\lambda 0.15$ and has an electrode width ratio $wr/pr$ of a reflector electrode width $wr$ to an electrode pitch $pr$ lying within the range of $0.5 \leq wr/pr \leq 0.6$ and has an electrode width ratio $wi/pi$ of an interdigital transducer interdigital electrode width $wi$ to a pitch $pi$ lying within the range of $0.6 \leq wi/pi \leq 0.9$.

4 Claims, 13 Drawing Sheets

SURFACE ACOUSTIC WAVE FILTER WITH OPTIMIZED WIDTH AND PITCH OF INTERDIGITAL ELECTRODES AND REFLECTOR ELECTRODES

BACKGROUND OF THE INVENTION

1. Field of the Invention

The present invention relates generally to a surface acoustic wave filter and, more particularly, to a surface acoustic wave filter having a widened band and a lowered insertion loss, advantageous to application to a high-frequency circuit of a radio apparatus.

2. Description of the Related Arts

The high-frequency circuit of the radio apparatus typically uses a filter. Wide-band filter characteristics are required for an SAW (surface acoustic wave) device which is an indispensable key device for the filter.

A surface acoustic wave filter formed of such an SAW (surface acoustic wave) device includes a piezoelectric substrate on which are formed interdigital transducers (IDTS) having interdigital electrodes and reflectors having grating electrodes. It is commonly known that the widened band of the surface acoustic wave filter is achieved by increasing the thickness of the electrodes. However, increased electrode thickness may impair the insertion loss which is a key characteristic of the filter.

In this manner, the electrode thickness has hitherto been increased to achieve the widened band in spite of possible deterioration of the insertion loss and further of the passband arising from impedance mismatching.

It was therefore an essential problem to realize the wide band and low insertion loss of the surface acoustic wave filter.

SUMMARY OF THE INVENTION

In view of the above problems, an object of the present invention is attained on the assumption that use is made of an electrode thickness capable of widening the band and that use is made of optimum cutting orientation for the piezoelectric substrate.

It is another object of the present invention to provide a surface acoustic wave filter free from any loss arising from the impedance mismatching by finding out optimum values achieving a widened band and lowered loss for the electrode width of the interdigital transducer electrodes and reflector electrodes.

According to an aspect of the present invention, to achieve the above object there is provided a surface acoustic wave filter having interdigital electrodes formed on a piezoelectric substrate, the surface acoustic wave filter including an interdigital transducer having interdigital electrodes and reflectors arranged on both sides of the transducer, wherein a ratio $h/\lambda$ of thickness h of the interto a surface acoustic wave wavelength $\lambda$ lying within the range of $0.05 \leq h/\lambda \leq 0.15$, and where in the piezoelectric substrate has an electrode width ratio wr/pr of a reflector electrode width wr to a reflector electrode pitch pr lying within the range of $0.5 \leq wr/pr \leq 0.6$, and wherein the piezoelectric substrate has an electrode width ratio wi/pi of an electrode width wi of the interdigital transducer to an electrode pitch pi of the interdigital transducer lying within the range of $0.6 \leq wi/pi \leq 0.9$.

Preferably, to achieve the above object, when the ratio wi/pi of the electrode width wi to the pitch pi of the interdigital electrodes of the transducer lies within the range of $0.62 \leq wi/pi \leq 0.9$, the relationship between the electrode width wi of the interdigital electrodes and the electrode width wr of the reflectors is given as wi>wr and the relationship between the electrode pitch pi of the interdigital electrodes and the electrode pitch pr of the reflectors is given as pi<pr.

Preferably, to attain the above object, when the distance between centers of adjoining electrode fingers of the interdigital electrodes and of the reflector electrodes is given as $(\frac{1}{2}+HD1) \times \lambda i$ where $\lambda i$ is a wavelength in the interdigital electrodes, the coefficient HD1 is defined in the range of $0 > HD1 \geq -0.04$.

Preferably, to attain the above object, the piezoelectric substrate is formed by a rotational Y-plate of $LiTaO_3$ obtained by rotating Y-axis through 40° to 44° around X-axis in the direction of Z-axis, and the interdigital electrodes of the transducer and electrodes of reflectors are formed of an electrode material made mainly of Al.

BRIEF DESCRIPTION OF THE DRAWINGS

The above and other objects, aspects, features and advantages of the present invention will become more apparent from the following detailed description when taken in conjunction with the accompanying drawings, in which.

DESCRIPTION OF THE PREFERRED EMBODIMENTS

The present invention will now be described with reference to the accompanying drawings which illustrate presently preferred embodiments in a non-limitative manner. It is to be noted that the embodiments shown in the diagrams are intended only for the purpose of understanding of the present invention and that applications of the present invention are not limited to such examples.

Figure 1:
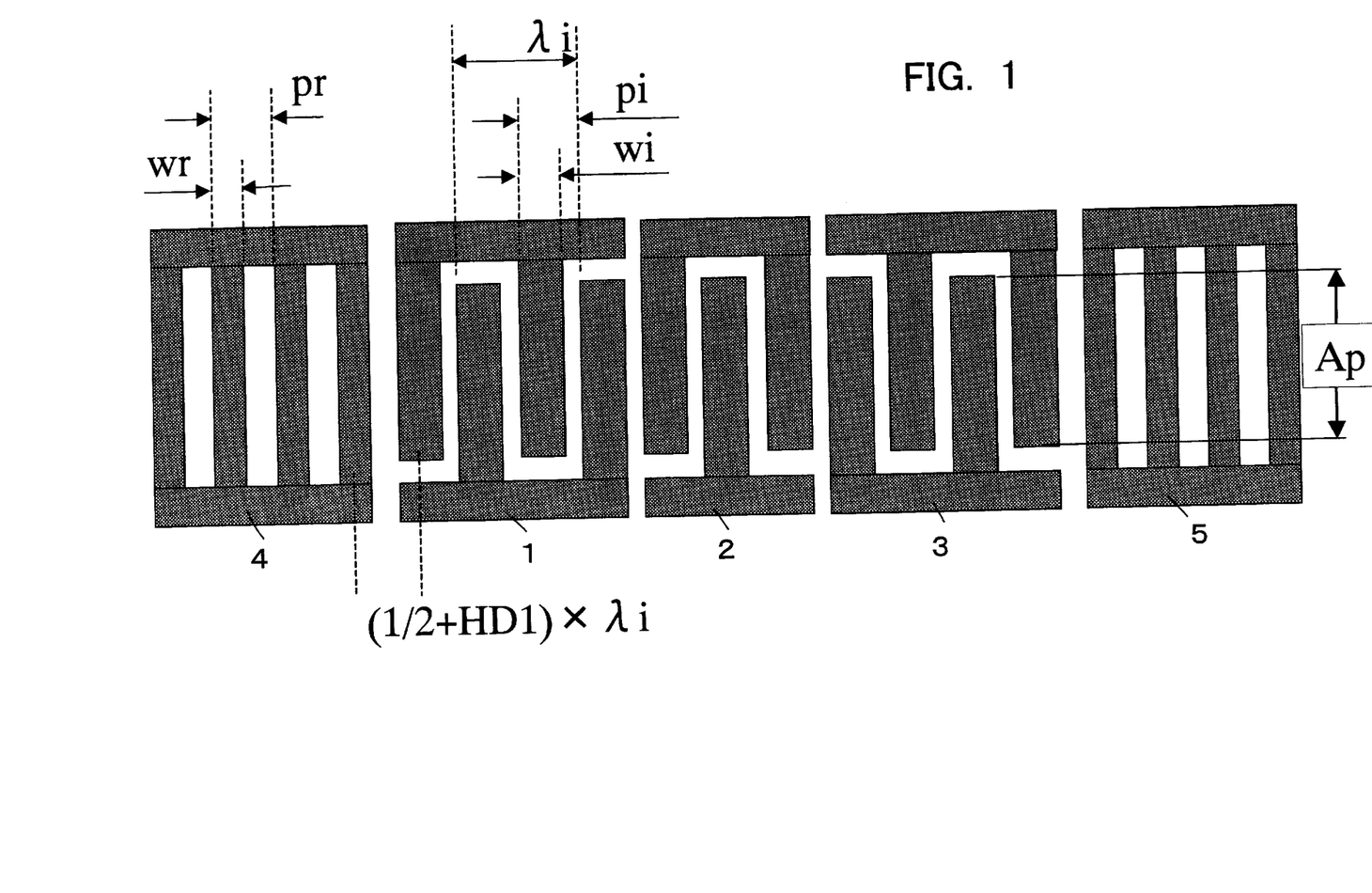
FIG. 1 is a diagram showing the structure of electrodes of a multiplex mode surface acoustic wave filter by way of example to which the present invention is applied.

FIG. 1 is a diagram showing the structure of electrodes of a multiplex mode surface acoustic wave filter as an example to which the present invention is applied. The shown structure includes interdigital transducers (IDTs) 1, 2 and 3 in the form of three interdigital electrodes formed of thin film electrodes on a piezoelectric substrate, and two grating reflectors 4 and 5 (hereinafter referred to simply as reflectors) disposed outside the transducers.

The interdigital transducers 1, 2 and 3 each have a plurality of interdigital electrodes and the reflectors 4 and 5 each have a plurality of electrodes that are formed in parallel at a predetermined interval.

Herein, to obtain an surface acoustic wave filter having good pass-band characteristics, the applicant of the present invention has proposed the use of a $LiTaO_3$ substrate as the piezoelectric substrate, the piezoelectric substrate being formed of 42° YX (rotation of 42° of Y-axis around X-axis in the direction of Z-axis) and further proposed setting of the ratio $h/\lambda$ within the range of $0.05 \leq h/\lambda \leq 0.15$ where h is an electrode thickness and $\lambda$ is a wavelength of the surface acoustic wave, of the interdigital transducers formed of thin film electrodes on the piezoelectric substrate and of the reflectors arranged on both sides of the transducers.

Thus, on the assumption that such setting requirements are used, the present invention is directed to acquisition of a surface acoustic wave filter capable of finding out optimum values that ensure a wide band and a low loss for the electrode widths of the interdigital transducer and reflectors, and free from any loss arising from impedance mismatch.

Provided the mode of use of the multiplex mode surface acoustic wave filter in FIG. 1 is such that e.g., the interdigital transducers 1 and 3 are used for input, one electrode of each of the interdigital transducers 1 and 3 is connected to an input terminal, with the opposite interdigital electrode being grounded. One electrode of the interdigital transducer 2 for output is connected to an output terminal, with the opposite interdigital electrode being grounded.

A plurality of surface acoustic waves excited by the interdigital transducers 1, 2 and 3 are confined between the reflectors 4 and 5, and as a result of coupling among the interdigital transducers 1, 2 and 3, a plurality of resonance modes are accentually excited so that termination of the resonance modes allows a function as the multiple mode surface acoustic wave filter.

The frequency bandwidth characteristics of the surface acoustic wave filter are determined by the overlap of any bandwidth characteristics confined by the reflectors 4 and 5 and the passband characteristics of the interdigital transducers 1, 2 and 3.

In FIG. 1, $\lambda i$ denotes the wavelength of the surface acoustic wave of the interdigital transducers 1, 2 and 3, wi denotes the electrode width of the interdigital transducers 1, 2 and 3, and pi denotes the inter-electrode pitch thereof.

Likewise, wr denotes the electrode width of the reflectors 4 and 5, and pr denotes the inter-electrode pitch thereof.

Figure 2:
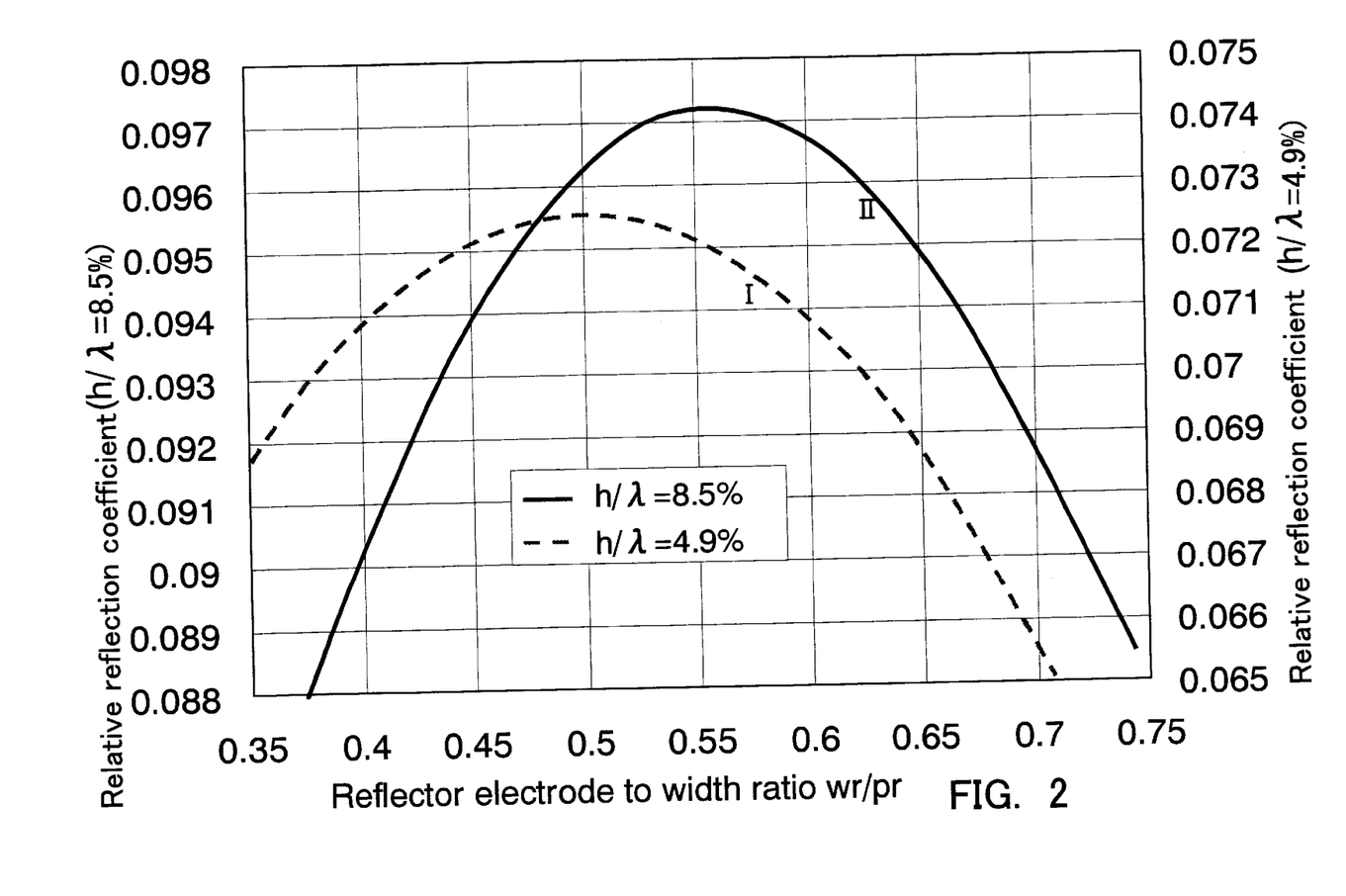
FIG. 2 is a graphical representation showing the dependency on the electrode thickness of the reflection coefficient relative to the electrode width ratio wr/pr of the electrode width wr to the electrode pitch pr of reflectors 4 and 5.

FIG. 2 is a graphic representation showing the dependency on the electrode thickness, of the reflection coefficient relative to the electrode width ratio wr/pr of the electrode width wr of the reflectors 4 and 5 to the electrode pitch pr. In FIG. 2, a curve I represents reflection coefficient characteristics for $h/\lambda i=4.9\%$ with the electrode thickness h, and a curve II represents reflection coefficient characteristics for $h/\lambda i=8.5\%$. The axis of abscissas represents the electrode width ratio wr/pr and the axis of ordinates represents the value of the reflection coefficient.

From this diagram, it can be understood that a larger electrode thickness h results in a larger peak (maximum) value of the reflection coefficient of the reflectors 4 and 5. It can further be seen that the electrode width of the reflectors 4 and 5 providing the peak value also migrates toward a larger value. This enables the bandwidth to be widened.

Figure 3:
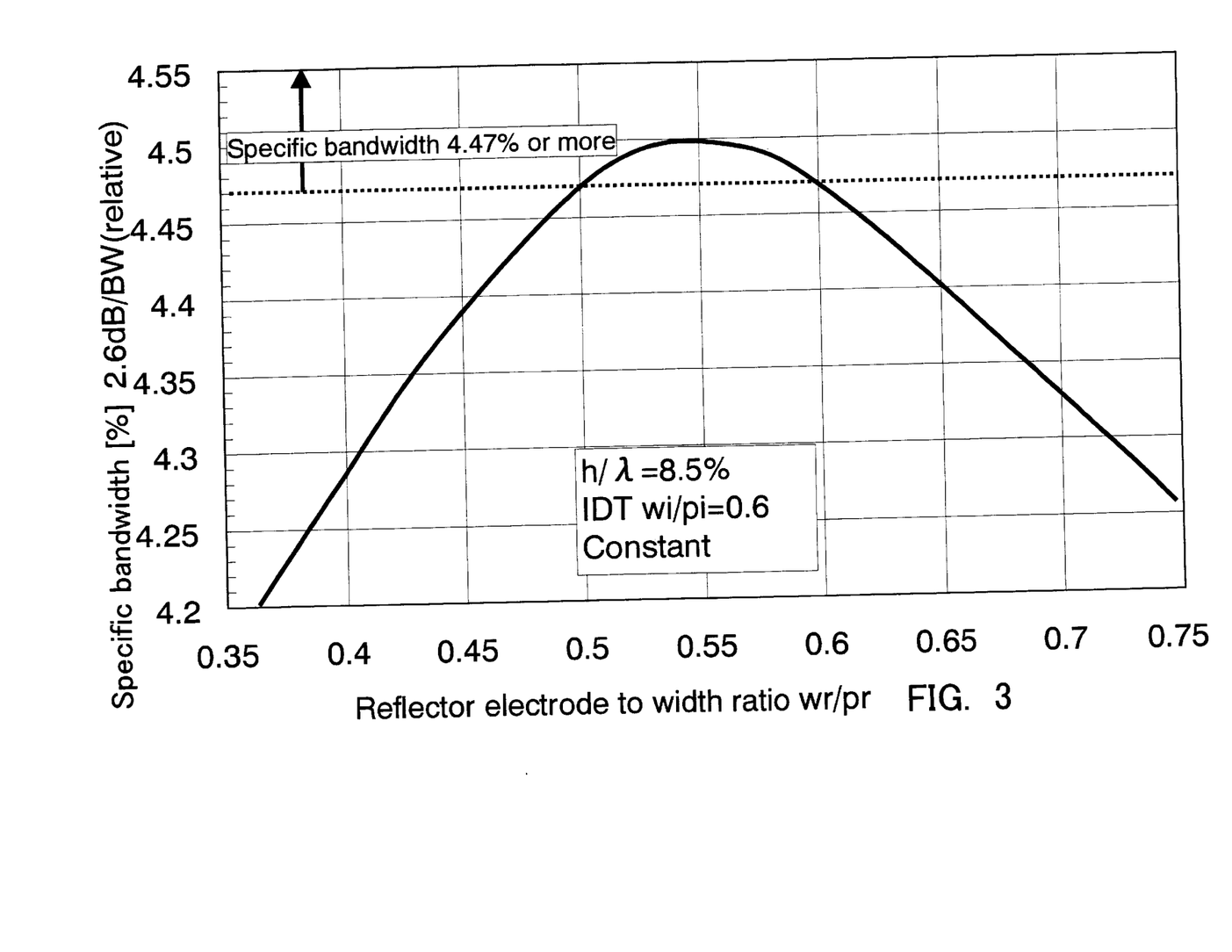
FIG. 3 is a graphical representation showing variation of the specific bandwidth relative to the reflector electrode width ratio wr/pr.

FIG. 3 is a graphical representation showing a specific bandwidth for the electrode width ratio wr/pr of the electrode width wr to the electrode pitch pr of the reflectors 4 and 5. From this graph of FIG. 3, it can be seen that in order to achieve a specific bandwidth of 4.47% or more required for the filter, the electrode width ratio wr/pr of the reflectors 4,5 has only to be set to the range of 0.5 to 0.6. It will be understood that the range of this electrode width ratio wr/pr from 0.5 to 0.6 is a region providing larger reflection coefficients of the reflectors 4 and 5 in FIG. 2 as well.

Figure 4:
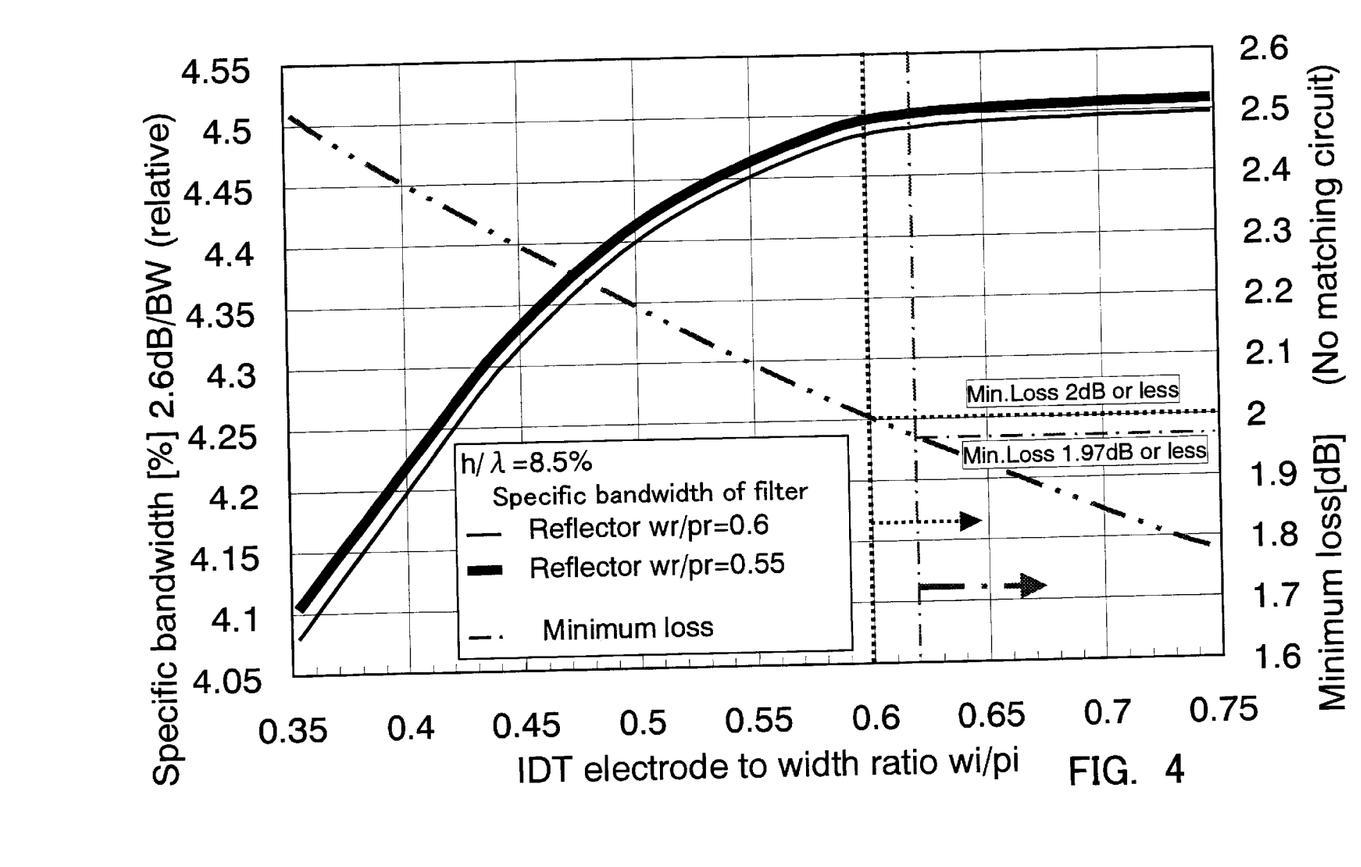
FIG. 4 is a graphical representation showing the result of measurement of the minimum loss characteristics and the specific bandwidth depending on the electrode width ratio wi/pi of the electrode width wi of an interdigital transducer to the electrode pitch pi.

FIG. 4 is a graphical representation obtained as a result of measurement of the minimum loss characteristics and the specific bandwidth when the electrode width ratio wr/pr of the reflectors 4 and 5 is set to the range of 0.5 to 0.6 (wr/pr=0.55 and 0.6), the electrode width ratio wr/pr depending on the electrode width ratio wi/pi of the electrode width wi to the interelectrode pitch pi of the interdigital transducers 1, 2 and 3.

From FIG. 4, it can be seen that it is possible to reduce the loss by increasing the electrode width wi of the interdigital transducers 1, 2 and 3.

Thus, by setting the electrode width ratio wi/pi to a value of 0.6 or more, the minimum loss (Min. Loss), which is an indispensable parameter of the filter can be suppressed to 2 dB corresponding to 37% or less. At that time, the specific bandwidth of the filter is substantially constant. More preferably, the electrode width ratio wi/pi of 0.62 or more results in the minimum loss (Min. Loss) of 1.97 dB dB or less corresponding to approx. 36% or less, with the specific bandwidth of the filter being substantially constant.

Figure 5:
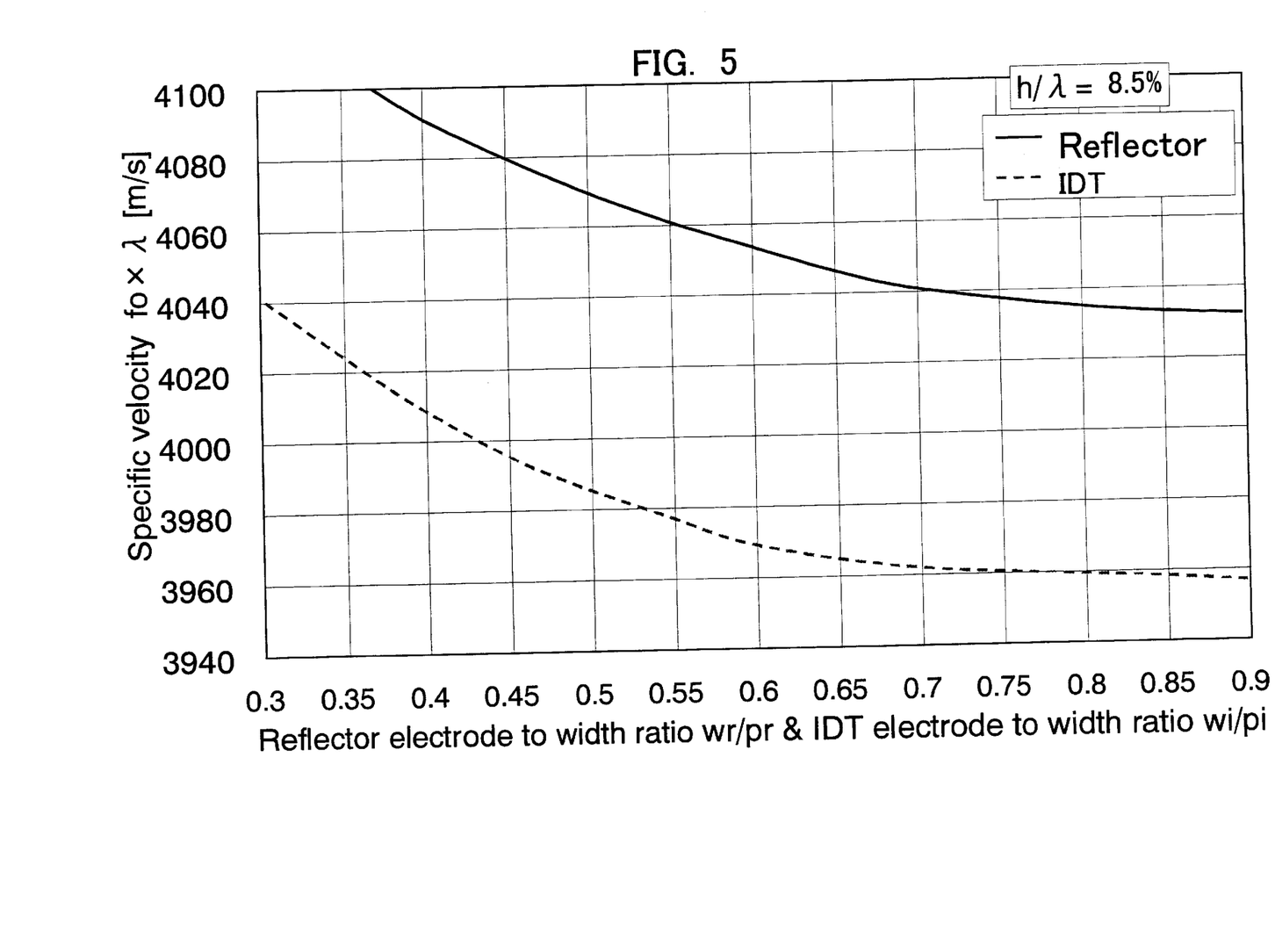
FIG. 5 is a graphical representation showing the specific velocity of the surface acoustic wave corresponding to variation of the electrode width ratios wr/pr and wi/pi.

Herein, when the electrode width ratios wr/pr and wi/pi are set within the above range, the velocity of the surface acoustic wave varies in response to variation of the electrode width ratios wr/pr and wi/pi, as shown in FIG. 5.

Accordingly, to set the center frequency of the interdigital transducers and the reflectors based thereon to an appropriate frequency, the relationship of the period needs to be set to pi<pr when the relationship of the electrode width is wi>wr. In FIG. 5, the electrode width ratios wr/pr and wi/pi of 0.9 shows the electrode manufacturing limit value.

Figure 6:
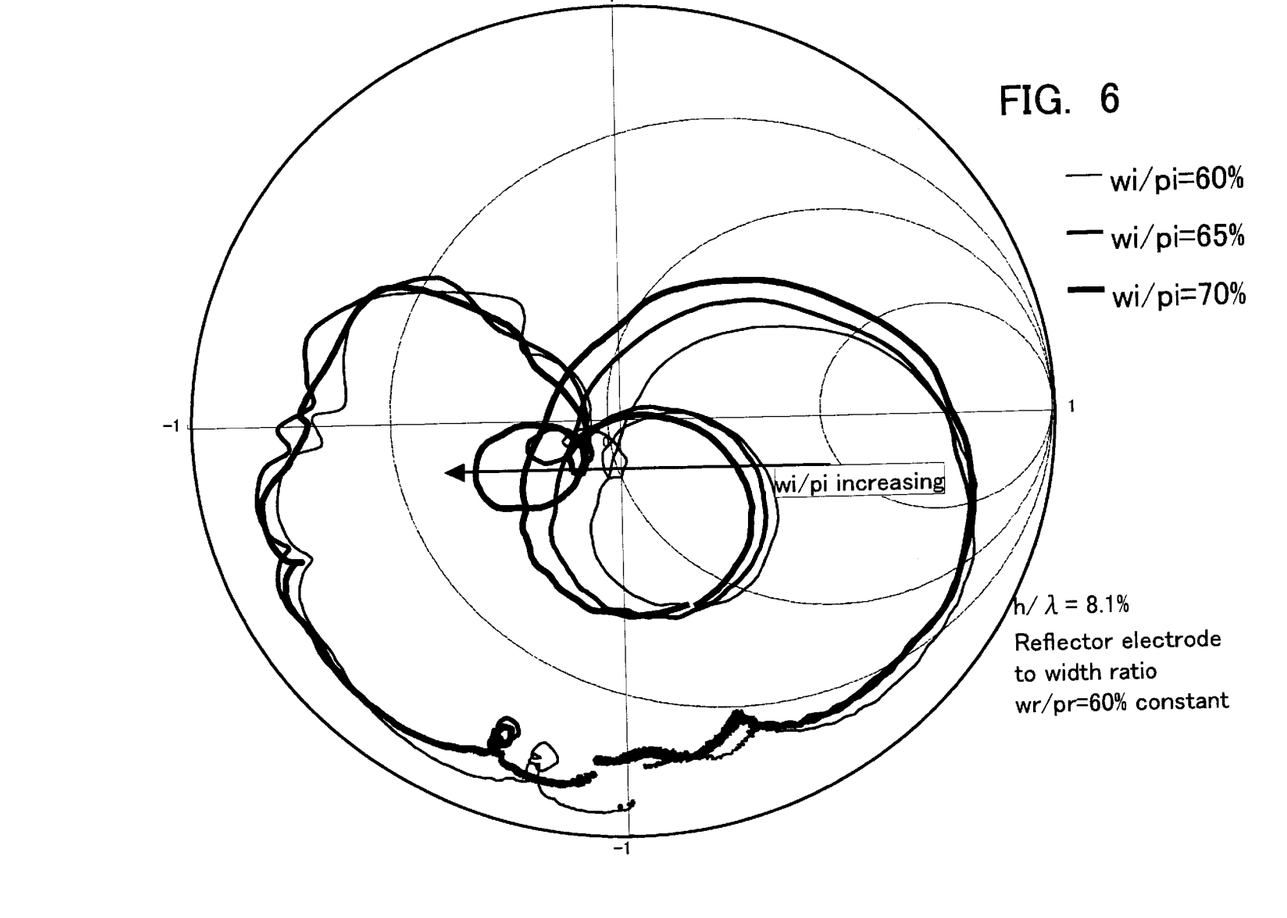
FIG. 6 is a Smith chart showing the impedance variation depending on the magnitude of the width ratio wi/pi of interdigital electrodes.

In case of setting the interdigital electrodes 1, 2 and 3 in the above manner, the width of the interdigital electrodes 1, 2 and 3 may urge the impedance mismatching. FIG. 6 is a diagram for explain this.

FIG. 6 is a Smith chart in which with the increasing electrode width ratio wi/pi, the impedance shifts toward the direction indicated by an arrow, resulting in an mismatching. This needs to therefore be corrected.

Figure 7:
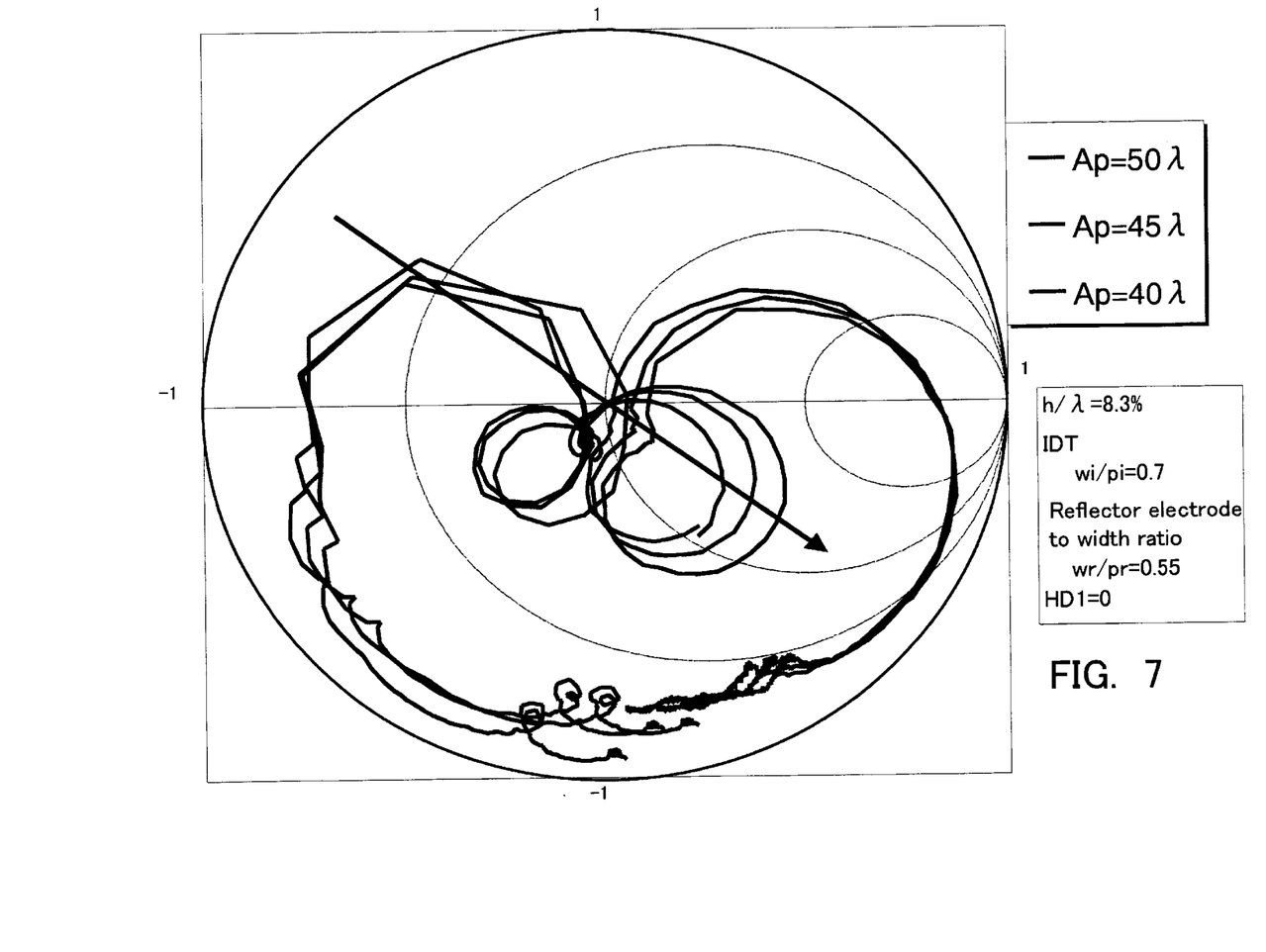
FIG. 7 is a Smith chart for explaining the correction of the impedance variation of FIG. 6 based on the aperture length AP of the interdigital electrodes.

By varying the overlapped width AP of the interdigital electrodes of FIG. 1, it is possible as shown in FIG. 7 to achieve the impedance compensation in the opposite direction to that in FIG. 6. However, as shown in FIG. 7, it was difficult to perform full compensation for the filter having a widened bandwidth due to an increased offset in the impedance frequency as shown in FIG. 7.

Thus, the inventors have found out that it is possible to obtain an impedance matching by varying a coefficient HD1 for adequate compensation when the distance between center lines of the most proximate interdigital electrode finger and reflector electrode finger of the adjoining interdigital transducers 1, 3 and the reflectors 4, 5 is given as $$(½+HD1)×λi$$

where HD1 is a coefficient.

This means that setting of the coefficient HD1 to an arbitrary value enables the wide band and low loss to be realized.

Figure 8:
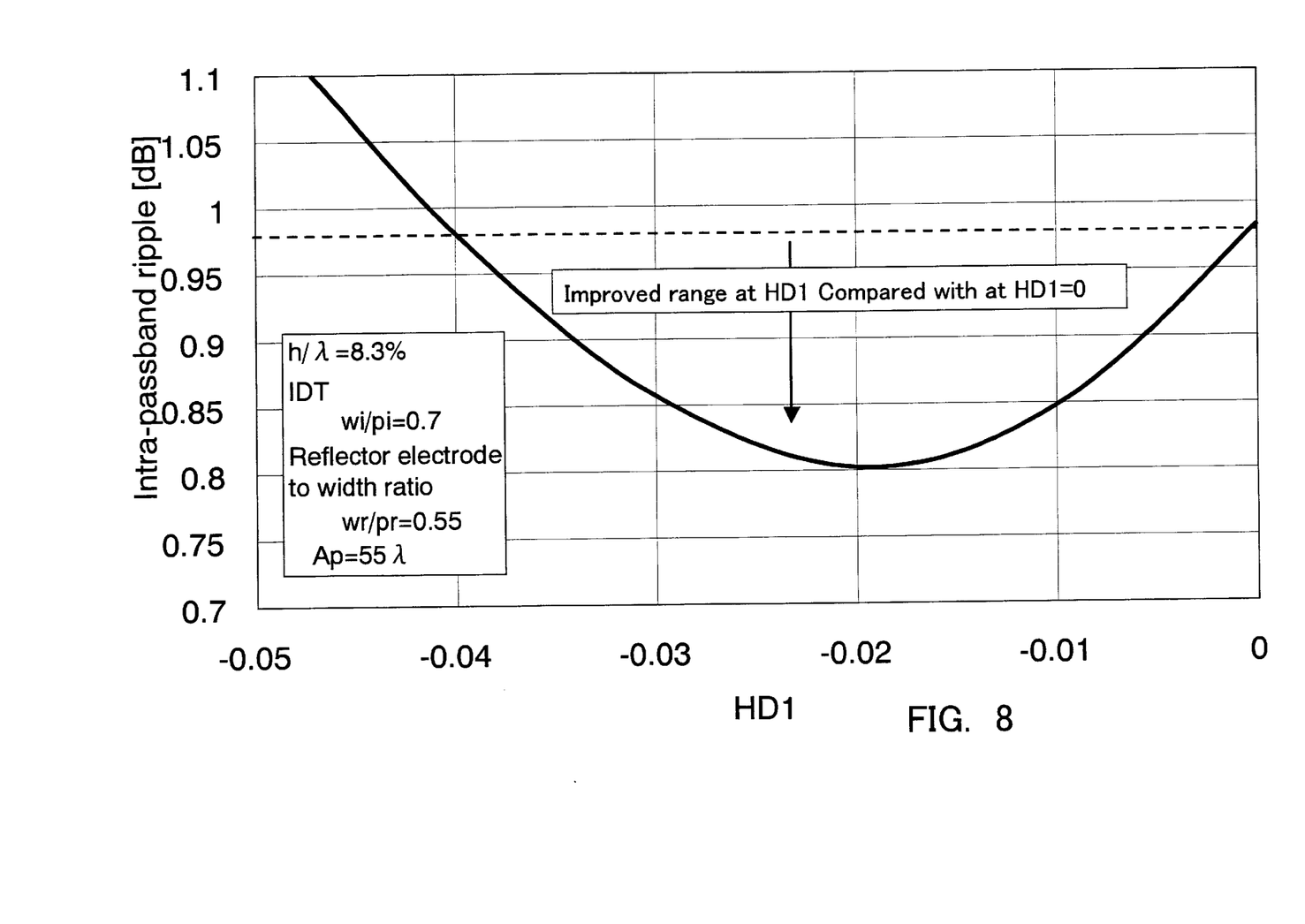
FIG. 8 is a diagram showing the relationship between the coefficient HD1 and the passband ripple.

FIG. 8 is a diagram showing a relationship between HD1 and a passband ripple. As used herein, the intra-passband ripple means the magnitude of the difference between the minimum loss within the passband and the ripple-induced maximum loss.

In case of the high-frequency (RF) filter, it will not be desirable for this intra-passband ripple to have a large value since the filter output frequency deviation becomes larger, resulting in a larger amount of correction in an amplifier that follows.

In case of the intermediate frequency (IF) filter, the frequency deviation of a modulation signal passing through the passband becomes larger, with the result that a demodulation signal tends undesirably to suffer a larger distortion.

Returning to FIG. 8 for description, the ripple reduce s within the range of 0>HD1≧−0.04, as compared with the ripple at HD1=0.

Figure 9:
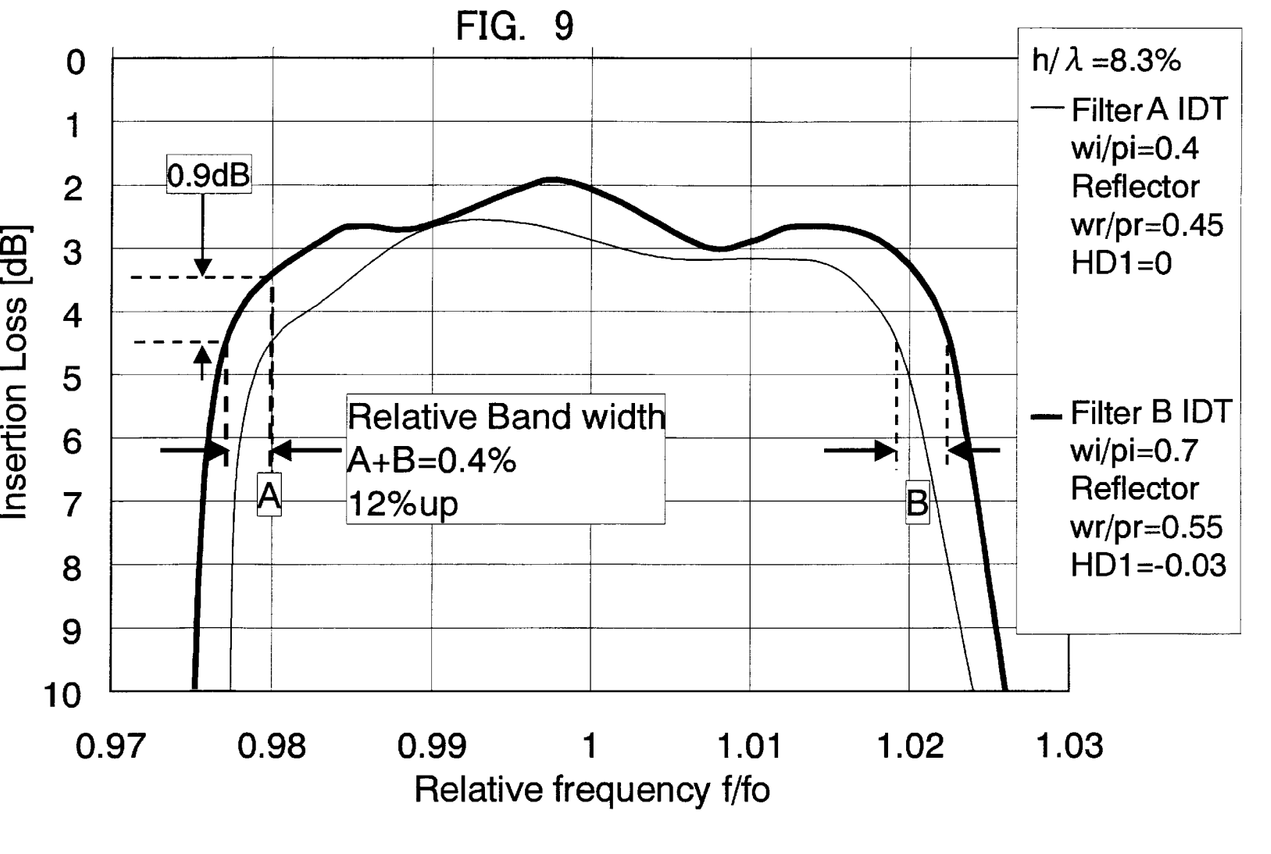
FIG. 9 is a diagram showing the comparison of the surface acoustic wave characteristics obtained by setting of conditions according to the present invention with those of the conventional filter.

FIG. 9 is a diagram showing the result of comparison of the surf ace acoustic wave characteristics obtained by the setting of conditions according to the above present invention with the case of the conventional filter. FIG. 9 revealed that band widening of approx. 12% can be achieved in the specific bandwidth, with a low insertion loss of the order of 0.9 dB.

[Embodiment 1]

Figure 10:
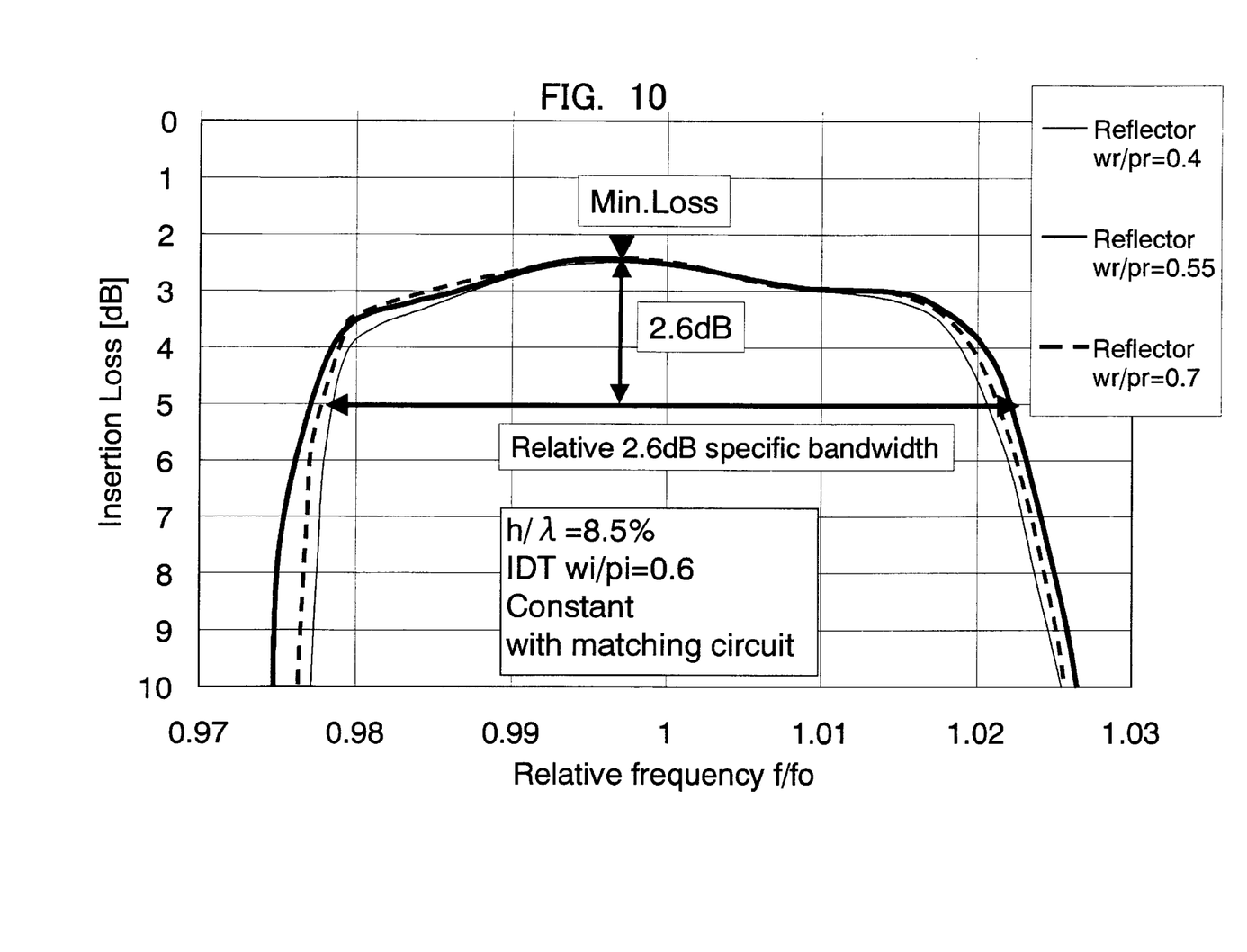
FIG. 10 is a frequency characteristic diagram showing the insertion loss variation upon the modification of the reflector electrode width ratio wr/pr in an embodiment of the present invention.

FIG. 10 is a diagram showing the characteristics of the embodiment of the present invention. FIG. 10 depicts variation of the characteristics obtained when the reflector electrode width ratio wr/pr is varied to 0.4, 0.55 and 0.7 with the constant thickness h/λ=8.5% and constant interdigital electrode width ratio wi/pi=0.6. From this diagram, it can be seen that the relative 2.6 dB specific bandwidth of the filter varies by modifying the reflector electrode width ratio wr/pr.

Referring back to FIG. 3 for validation, with the modification of the reflector electrode width ratio wr/pr, the relative 2.6 dB specific bandwidth of the filter becomes equal to or exceeds 4.47% necessary for the system within the range of 0.5≦wr/pr 0.6.

[Embodiment 2]

Figure 11:
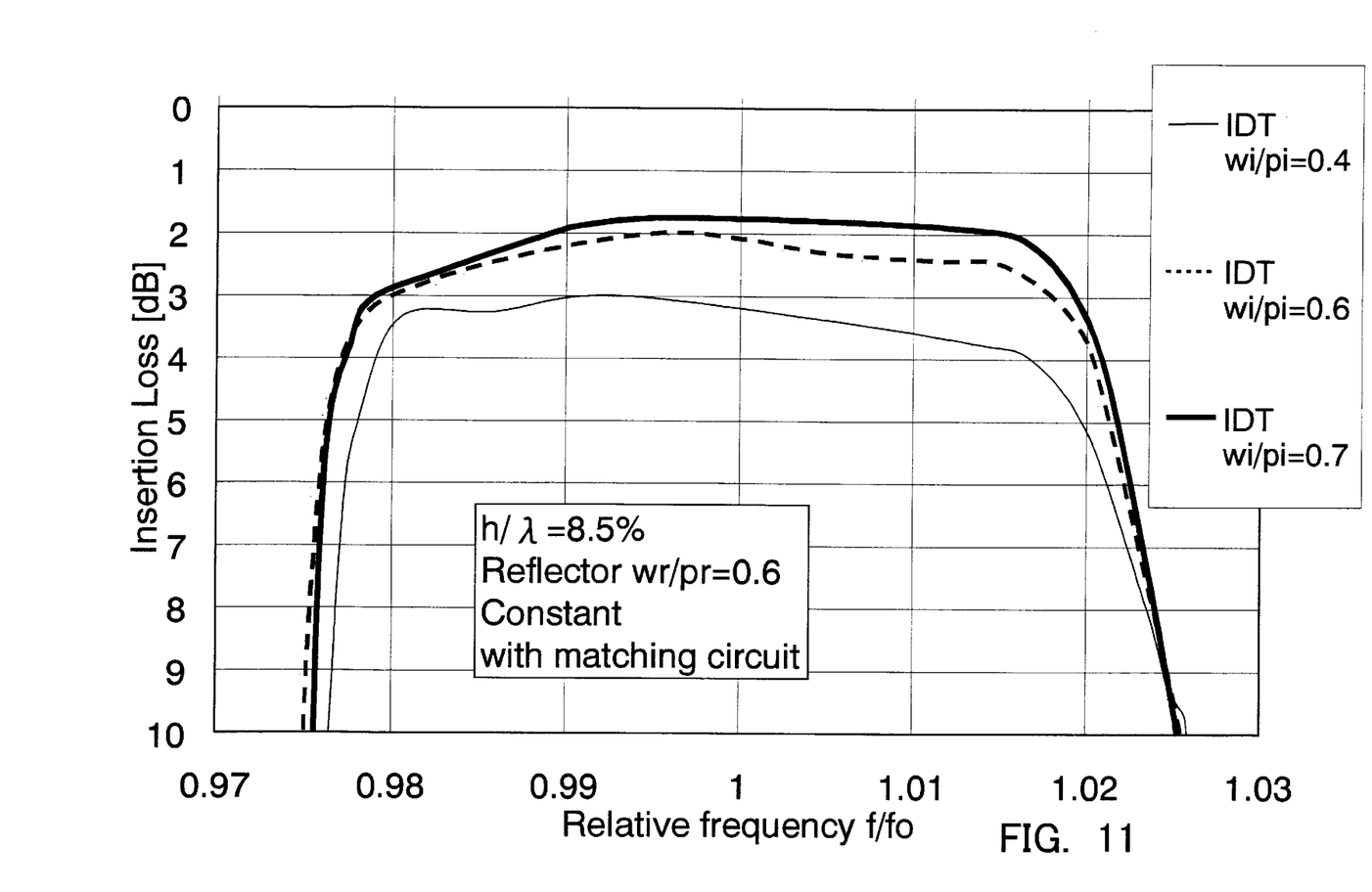
FIG. 11 is a frequency characteristic diagram showing the insertion loss variation upon the modification of the interdigital transducer electrode width ratio wi/pi in an embodiment of the present invention.

FIG. 11 shows variation of the characteristics obtained when the electrode width ratio wi/pi of the interdigital electrode is varied to 0.4, 0.6 and 0.7 with the constant thickness h/λi=8.5% and constant reflector electrode width ratio wr/pr=0.6. From this diagram, it can be seen that the filter loss varies by modifying the interdigital electrode width ratio wi/pi.

Referring back to FIG. 4 for validation, with the modification of the electrode width ratio wi/pi of the interdigital electrode, the minimum insertion loss of the filter falls below about 2 dB corresponding to 36% or less within the range of 0.62≦wi/pi.

The upper limit of the interdigital electrode width ratio wi/pi results in wi/pi≦0.9 which is the manufacturing limit.

[Embodiment 3]

Figure 12:
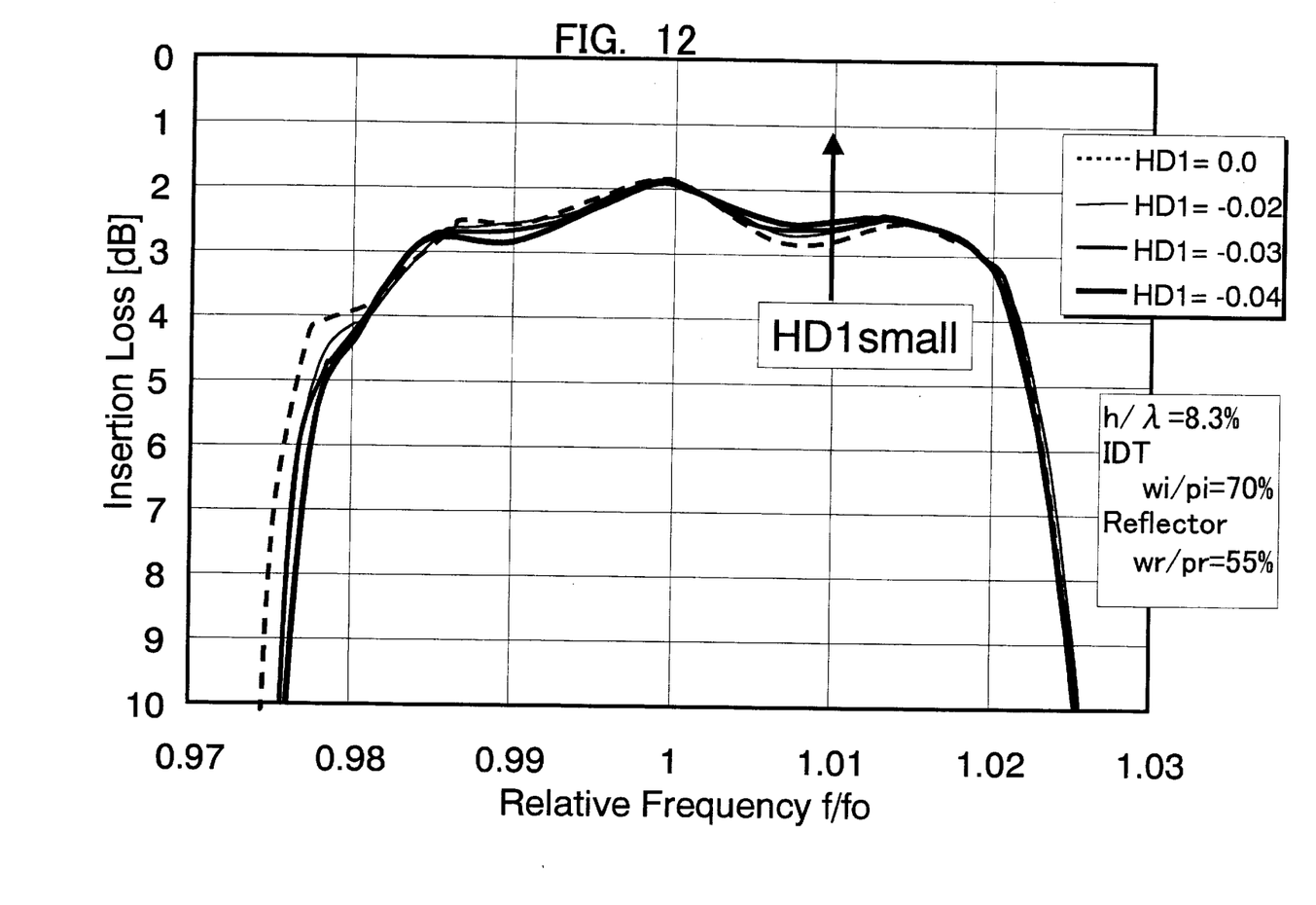
FIG. 12 is a frequency characteristic diagram showing the insertion loss variation upon the modification of the coefficient HD1.
Figure 13:
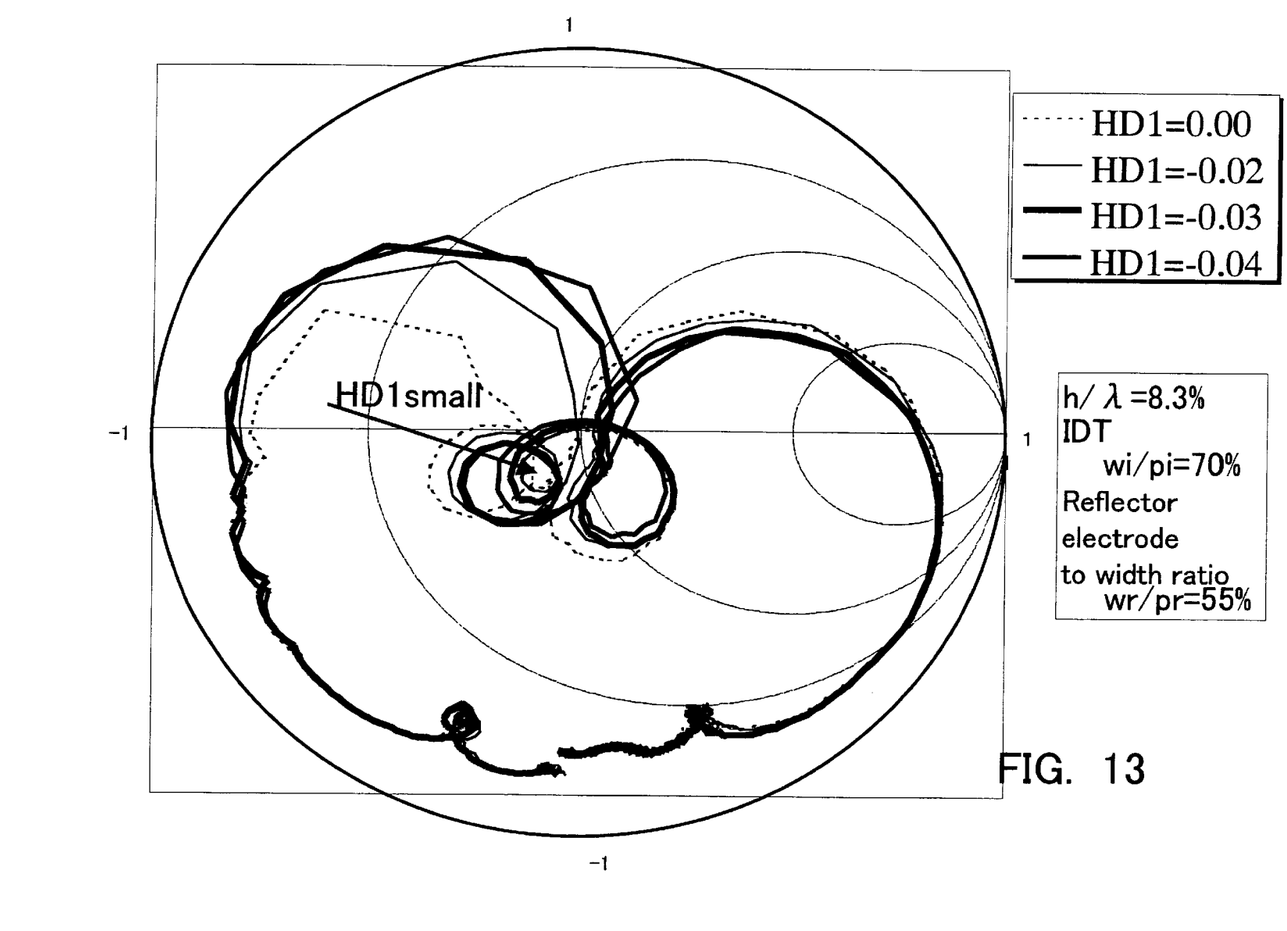
FIG. 13 is a Smith chart showing the impedance variation upon the modification of the coefficient HD1.

FIGS. 12 and 13 depict variation of the characteristics obtained by varying the coefficient HD1 from 0 to −0.04, when the distance between centerlines of the interdigital electrode most proximate to the reflectors 4, 5 and of the reflector electrode proximate to that interdigital electrode is given as (½+HD1)×λi, where h/λi=8.5% , the interdigital electrode width ratio wi/pi=0.7, the reflector electrode width ratio wr/pr=0.55 and the overlapped width AP=55 λ of electrodes.

It can be seen from FIG. 12 that the absolute 2.5 dB specific bandwidth of the filter is varied by modifying the coefficient HD1. Referring back to FIG. 8 for validation, the filter intra-passband ripple becomes smaller within the range of 0>HD1≧−0.04 than the case of HD1=0, with the result that the available band is widened.

[Embodiment 4]

In FIG. 9, with the thickness h/λ=8.3%, a filter A represents the filter passing characteristics when the interdigital electrode width ratio wi/pi=0.4, the reflector electrode width ratio wr/pr=0.45, the aperture length of the electrodes AP=75λ and HD1=0, whilst a filter B represents the filter passing characteristics when the interdigital electrode width ratio wi/pi=0.7, the reflector electrode width ratio wr/pr=0.55, the aperture length of the electrodes AP=55λ and HD1=−0.03.

As a result of comparison of the two filters, approx. 12% of band widening was achieved in the absolute 4.5 dB specific bandwidth, with lowered insertion loss of approx. 0.9 dB.

[Piezoelectric substrate]

The piezoelectric substrate for use in the above embodiments was formed from orientation through the rotation of 40° to 44° from Y-axis toward Z-axis around X-axis with LiTaO₃ single crystal. In the application of the present invention, the material of such a surface acoustic wave piezoelectric substrate is not limited to LiTaO₃ but instead other high coupling coefficient substrates could also be employed to obtain similar effects.

According to the embodiments of the present invention, as set forth hereinabove in conjunction with the drawings, a low loss and wide band surface acoustic wave filter can be obtained. A surface acoustic wave filter is provided that is free from any loss arising from impedance mismatching.

While illustrative and presently preferred embodiments of the present invention have been described in detail herein, it is to be understood that the inventive concepts may be otherwise variously embodied and employed and that the appended claims are intended to be construed to include such variation except insofar as limited by the prior art.

What is claimed is:

1. A surface acoustic wave filter having interdigital electrodes formed on a piezoelectric substrate, the surface acoustic wave filter comprising:

an interdigital transducer having interdigital electrodes; and reflectors arranged on the outside of said transducer, wherein a ratio h/λ of thickness h of the interdigital electrodes to wavelength λ lies within the range of 0.05≦h/λ≦0.15, a ratio wr/pr of a reflector electrodes width wr to an electrode pitch pr lies within the range of 0.5≦wr/pr<0.6, and a ratio wi/pi of an interdigital electrode width wi to a pitch pi lies within the range of $0.6 \leq wi/pi \leq 0.9$.

2. The surface acoustic wave filter according to claim 1, wherein when said electrode width ratio wi/pi of the electrode width wi to the pitch pi of said interdigital transducer interdigital electrodes lies within the range of $0.62 \leq wi/pi \leq 0.9$, the relationship between the electrode width wi of said interdigital electrodes and the electrode width wr of said reflectors is given as wi>wr and the relationship between the electrode pitch pi of said interdigital electrodes and the electrode pitch pr of said reflectors is given as pi<pr.

3. The surface acoustic wave filter according to claim 1, wherein when the distance between centers of adjoining electrodes of said interdigital electrodes and of said reflector electrodes is given as $$(\tfrac{1}{2}+HD1) \times \lambda i$$

where $\lambda i$ is a wavelength in said interdigital electrodes, said coefficient HD1 is defined in the range of $$0 > HD1 \geq 0.04$$

4. A surface acoustic wave filter according to claim 1, wherein said piezoelectric substrate is formed of a rotational Y-plate of $LiTaO_3$ cut out by rotating Y-axis through 40° to 44° around X-axis in the direction of Z-axis, and said interdigital electrodes and reflector electrodes are formed of an electrode material made mainly of Al.

* * * * *